United States Patent [19]

Abe et al.

[11] Patent Number: 4,758,176
[45] Date of Patent: Jul. 19, 1988

[54] IC SOCKET

[75] Inventors: Shunji Abe, Yokohama; Noriyuki Matsuoka, Tokyo, both of Japan

[73] Assignee: Yamaichi Electric Mfg. Co., Ltd., Tokyo, Japan

[21] Appl. No.: 70,718

[22] Filed: Jul. 7, 1987

[30] Foreign Application Priority Data

Jul. 10, 1986 [JP] Japan ................. 61-162497

[51] Int. Cl.⁴ .............................. H01R 9/09
[52] U.S. Cl. ..................... 439/331; 439/72; 439/73
[58] Field of Search ................. 439/68-73, 439/264, 330, 331, 525, 526

[56] References Cited

U.S. PATENT DOCUMENTS 4,502,747 3/1985 Bright et al. ............... 439/71
4,515,424 5/1985 Sakurai ...................... 439/68
4,657,328 4/1987 Matsuoka .................... 439/68
4,688,870 8/1987 Egawa et al. ................ 439/331

Primary Examiner—John McQuade
Attorney, Agent, or Firm—Wenderoth, Lind & Ponack

[57] ABSTRACT

An IC socket includes a socket body which has an IC package placing area and resilient contacts around the IC package placing area, a cover pivotally attached to the socket body, a lock member pivotally attached to either the socket body or the cover for locking/unlocking the cover relative to the socket body, and IC lead pressing means movably mounted on the cover. The IC lead pressing means is provided integrally with pads for pressing the IC leads against the resilient contacts and is adapted to effect self-adjustment of its own movement so that the pads come into uniform contact with the IC leads.

6 Claims, 2 Drawing Sheets

IC SOCKET

BACKGROUND OF THE INVENTION AND RELATED ART STATEMENT

The present invention relates to an IC socket of the type for placing an IC package on an IC package placing area of a socket body to superpose IC leads of the IC package on resilient contacts of the socket body and closing a cover relative to the socket body to obtain reliable contact between the IC leads and the resilient contacts.

The IC socket of this type is disclosed such as in U.S. Pat. Nos. 4,515,424 and 4,560,216, for example, and is typically shown in FIG. 1.

The IC socket shown in FIG. 1 comprises a socket body 1, an IC lead pressing cover 2 rotatably attached to one end of the socket body 1 by means of a pivot 3 and integrally provided with pads 6 which project from the inner surface of the cover 2 to press IC leads 5 of an IC package 8 placed on the socket body 1 against resilient contacts 4 of the socket body 1, and a lock member 7 for locking/unlocking the cover 2 relative to the socket body 1. With this structure, the cover 2 is rotated about the pivot 3 and closed relative to the socket body 1 having the IC package 8 received in the IC package receiving area thereof with the IC leads 5 superposed on the corresponding resilient contacts 4, and the closed state is retained by means of the lock member 7, with the result that the pads 6 integral with the cover 2 press the IC leads 5 against the resilient contacts 4 to obtain electrical connection between the IC leads 5 and the resilient contacts 4. In the course of closing the cover 2 relative to the socket body 1, however, a lateral row of IC leads 5 arranged close to the pivot 3 is pressed at first by the pad 6 disposed close to the pivot 3 and the opposite lateral row of IC leads arranged away from the pivot 3 is then pressed by the pad 6 disposed away from the pivot 3. In other words, it is difficult to carry out simultaneous pressing of all IC leads 5 against the resilient contacts 4 by means of the pads. This means that deviation load is exerted onto the lateral row of IC leads 5 arranged close to the pivot 3 and that there is a fair possibility of the IC leads 5 being deformed. Furthermore, since the IC leads 5 in longitudinal rows are successively pressed by the pads 6 from the side close to the pivot 3 to the side close to the free end of the cover 2, deviation force will be applied to the IC leads 5 in the width direction. This may possibly cause deformation of the IC leads 5 and lateral displacement of the IC package 8.

OBJECT AND SUMMARY OF THE INVENTION

The main object of the present invention is to provide an IC socket capable of suitably pressing IC leads of an IC package against resilient contacts and reliably obtaining electrical connection between the IC leads and the resilient contacts without either exerting deviation load onto the IC leads or causing deformation of the IC leads and lateral displacement of the IC package.

To attain the object described above, according to the present invention, there is provided an IC socket comprising a socket body having an IC package placing area formed on the upper central portion thereof and resilient contacts provided around the IC package placing area for allowing superposition of and contact with IC leads of an IC package, a cover having one end thereof attached pivotally to one end of the socket body so as to be opened and closed relative to the upper surface of the socket body, a lock member pivotally attached to one of the other end of the socket body and the other end of the cover for causing the socket body and the cover to be locked with and unlocked from each other, and IC lead pressing means provided integrally with pads for pressing the IC leads against the resilient contacts, movably mounted on the cover, and adapted to effect self-adjustment of its own movement so that the pads come into uniform contact with the IC leads immediately before the lock member locks the socket body and the cover and, when the lock member has locked the socket body and the cover, press the IC leads against the resilient contacts with high reliability.

Therefore, the IC lead pressing means can adjust its movement during the course of closing the cover relative to the socket body to press all IC leads substantially at the same time with the pressing force directed substantially vertically to all IC leads.

The above and other objects, characteristic features and advantages of the present invention will become more apparent to those skilled in the art as the disclosure is made in the following description of preferred embodiments of the invention, as illustrated in the accompanying drawings.

DETAILED DESCRIPTION OF THE PREFERRED EMBODIMENTS

Figure 1:
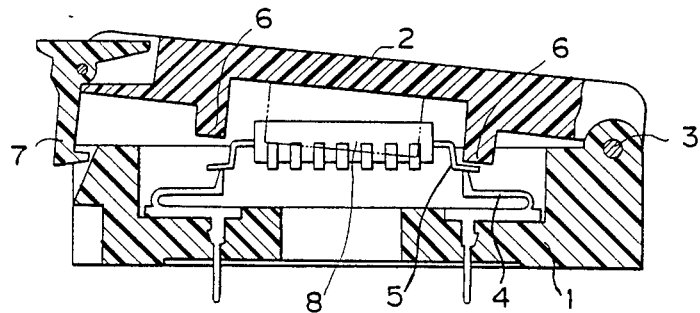
FIG. 1 is a cross section illustrating a prior art IC socket.

The present invention will now be described with reference to the embodiments illustrated in FIG. 2 through FIG. 7.

In any of the illustrated embodiments, the IC socket according to the present invention comprises a socket body 11 having an IC package receiving area and a plurality of resilient contacts 14, a cover 12 having one end thereof attached pivotally to one end of the socket body 11 by means of a pivot 13, a lock member 17 pivotally attached to the other end of the cover 12, and IC lead pressing means 16 (16', 16") provided integrally with pads 16a, movably mounted on the cover 12 and adapted to effect self-adjustment of its movement.

An IC package 18 to be placed on the IC package receiving area formed on the upper central portion of the socket body 11 has a plurality of IC leads 15 projecting outwardly from two or four sides thereof. The plurality of resilient contacts 14 of the socket body 11 are provided around the IC package receiving area of the socket body 11, specifically on two or four sides of the IC package receiving area corresponding to the sides of the IC package 18 on which the IC leads 15 are provided, so that the IC leads 15 are superposed on and brought into contact with the resilient contacts 14 when the IC package 18 is placed on the IC package receiving area of the socket body 11. The cover 12 is rotatable about the pivot 13, and is adapted to retain the IC package 18 in position and press the IC leads 15 against the resilient force of the resilient contacts 14 in cooperation with the IC lead pressing means 16 (16', 16") when it is closed relative to the socket body 11 and, when it is opened relative to the socket body 11, adapted to release the IC package 18. The closing state of the cover 12 is retained by engagement of the lock member 17 with the socket body 11. When the lock member 17 is disengaged from the socket body 11, the cover 12 is freely rotated about the pivot 13. The IC lead pressing means 16 (16', 16") is provided integrally with pads 16a, the number of which corresponds to the sides of the IC package 18 having the IC leads 15 projecting therefrom. The IC lead pressing means is movably mounted on the cover 12 and is capable of self-adjustment of its own movement.

Figure 2:
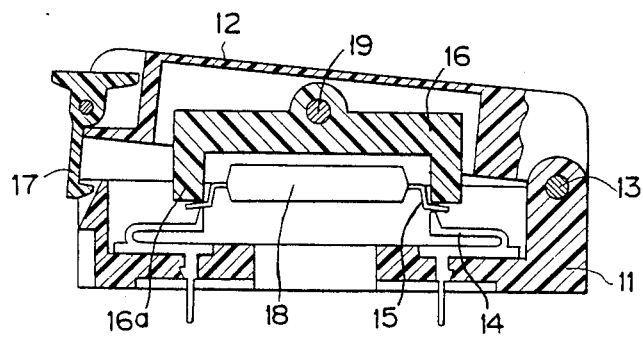
FIG. 2 is a cross section illustrating one embodiment of the IC socket according to the present invention.

To be specific, in the embodiment of FIG. 2, the IC lead pressing means 16 is disposed between the inner surface of the cover 12 and the IC package 18 placed on the IC package receiving area of the socket body 11 and is pivotally attached at the center thereof to the cover 12 by means of a pin 19 in parallel to the pivot 13. Therefore, the IC lead pressing means 16 is rotatable about the pin 19, with the opposite ends thereof moved vertically with the rotation about the pin 19. The pads 16a integral with the IC lead pressing means 16 are provided on a pair of opposite sides parallel to the pin 19 and/or another pair of opposite sides normal to the pin 19.

Figure 3:
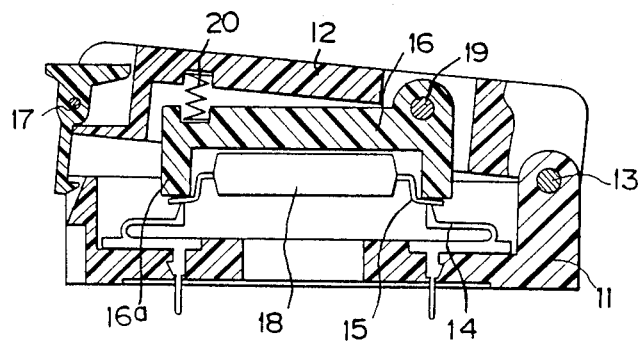
FIG. 3 is a cross section illustrating another embodiment of the IC socket according to the present invention.

In the embodiment illustrated in FIG. 3, the IC lead pressing means 16 has one end thereof on the side close to the pivot 13 attached pivotally to the cover 12 by means of a pin 19 parallel to the pivot 13 and also has the other end thereof on the side close to the free end of the cover 2 biased by a spring 20 in the direction of pressing the IC leads 15 against the resilient contacts 14.

Figure 4:
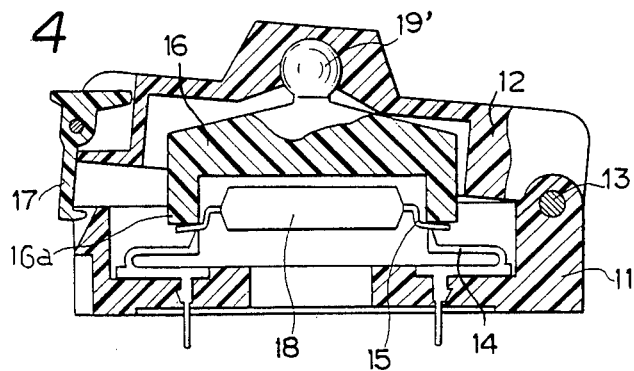
FIG. 4 is a cross section illustrating still another embodiment of the IC socket according to the present invention.

The embodiment of FIG. 4 uses a universal joint mechanism in place of the pivot mechanism used in the preceding embodiments shown in FIG. 2 and FIG. 3. In this embodiment, the IC lead pressing means 16 is coupled to the cover 12 with a ball 19' provided on either the IC lead pressing means 16 or the cover 12, whereby the movement of the IC lead pressing means 16 can be adjusted omnidirectionally.

Figure 5:
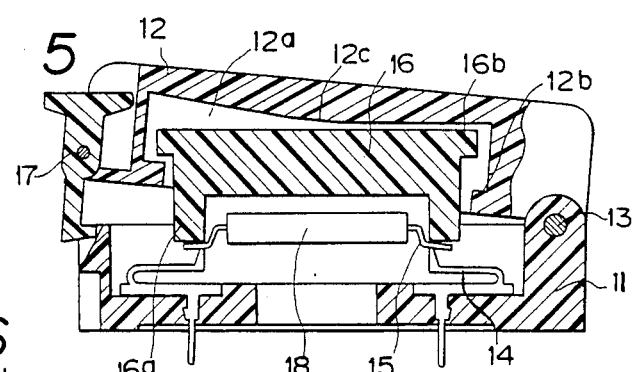
FIG. 5 is a cross section illustrating yet another embodiment of the IC socket according to the present invention.

In the embodiment illustrated in FIG. 5, the IC lead pressing means 16 is formed with an outward flange 16b, whereas the cover 12 is provided with an inward flange 12b engageable with the outward flange 16b, whereby the body of the IC lead pressing means 16 is loosely inserted within a sapce 12a defined by the inner surface of the cover 12 and the inward flange 12b. Therefore, the movement of the IC lead pressing means 16 can be adjusted in the lateral and vertical directions. In this embodiment, the inner surface of the cover 12 is inclined so that the central portion 12c thereof constitutes a projecting apex.

In the four preceding embodiments shown in FIG. 2 to FIG. 5, the IC lead pressing means 16 comprises a single member. The embodiments of the IC socket according to the present invention in which the IC lead pressing means 16 comprises a plurality of members will be described with reference to FIG. 6 and FIG. 7.

Figure 6:
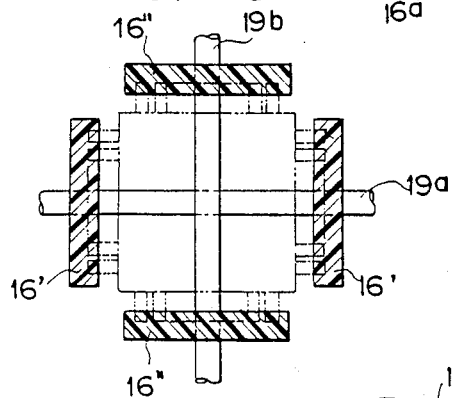
FIG. 6 is a cross-sectional plan view illustrating a further embodiment of the IC socket according to the present invention.

In FIG. 6, a pair of opposite IC lead pressing members 16' are pivotally supported by a pin 19a and another pair of opposite IC lead pressing members 16" are also pivotally supported by another pin 19b. Therefore, this embodiment can advantageously be utilized for an IC package having IC leads projecting from the four sides thereof. With this arrangement, the movement of the IC lead pressing members 16' and 16" can be adjusted during the pressing operation conducted relative to the IC leads.

Figure 7:
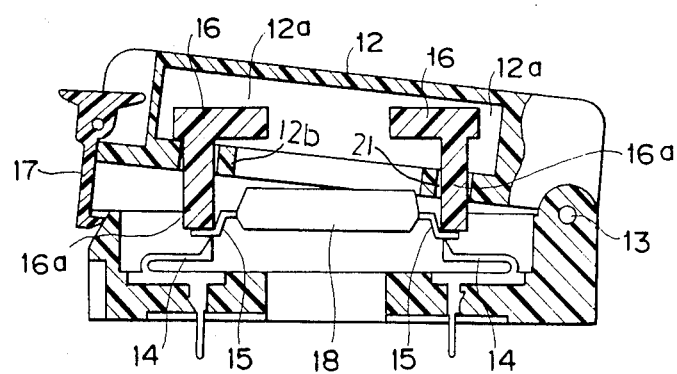
FIG. 7 is a cross section illustrating a still further embodiment of the IC socket according to the present invention.

In FIG. 7, the cover 12 is provided with seats 12b each having a through hole 21 through which the pad 16a of the IC lead pressing means 16 is loosely inserted. The bodies of the IC lead pressing means 16 are movably accommodated within a space 12a defined by the inner surface of the cover 12 and the seats 12b and are capable of being supported on the seats 12b. Therefore, the movement of the IC lead pressing means 16 can be adjusted in the lateral and longitudinal directions. The inner surface of the cover 12 regulates the longitudinal movement of the IC lead pressing means 16 and, when the cover 12 is closed relative to the socket body 11, facilitates that the pads 16a press the IC leads 15 against the resilient contacts 14. In this embodiment, a separate regulating member (not shown) may be integrally mounted on the inner surface of the cover 12 to regulate the longitudinal movement of the IC lead pressing means 16.

In the illustrated embodiments, the lock member 17 is pivotally attached to the free end of the cover 12. However, this is by no means limitative. It may be attached to the socket body 11 insofar as it can retain the closing state between the cover 12 and the socket body 11 and can release the closing state.

Further, even in a case where the cover 12 is not coupled to the socket body 11, the problems similar to those encountered by the prior art IC socket of FIG. 1 will arise depending on the posture of the cover 12 which is closed relative to the socket body 11. In such a case, the present invention can solve the problems by the use of the IC lead pressing means 16 (16', 16").

As has been described in the foregoing, according to the present invention, when the cover is closed relative to the socket body, the IC lead pressing means can effect self-adjustment of its own movement to correct its posture at all times into a posture optimum for pressing the IC leads against the resilient contacts. Therefore, any inconvenience caused by the posture of the cover assumed in closing the cover relative to the socket body, particularly the deformation of the IC leads and the lateral displacement of the IC package suffered by the prior art IC socket, can effectively be prevented. According to the present invention, therefore, electrical connection between the IC leads and the resilient contacts can be obtained with high reliability.

What is claimed is:

1. An IC socket comprising:
 a socket body having an IC package placing area formed on the upper central portion thereof and resilient contacts provided around said IC package placing area for allowing superposition of and contact with IC leads of an IC package,
 a cover having one end thereof attached pivotally to one end of said socket body so as to be opened and closed relative to the upper surface of said socket body, a lock member pivotally attached to one of the other end of said socket body and the other end of said cover for causing said socket body and said cover to be locked with and unlocked from each other, and IC lead pressing means provided integrally with pads for pressing the IC leads against said resilient contacts, movably mounted on said cover, and adapted to effect self-adjustment of its own movement so that said pads come into uniform contact with the IC leads immediately before said lock member locks said socket body and said cover and, when said lock member has locked said socket body and said cover, press the IC leads against said resilient contacts with high reliability.

2. An IC socket according to claim 1, wherein said IC lead pressing means is swingably attached to said cover with a pin.

3. An IC socket according to claim 1, wherein said IC lead pressing means is attached to said cover with a universal joint so that said IC lead pressing means moves omnidirectionally.

4. An IC socket according to claim 1, wherein said IC lead pressing means is loosely fitted within a space defined by the inner surface of said cover and the IC package placing area of said socket body.

5. An IC socket according to claim 1, wherein said IC lead pressing means comprises a single member.

6. An IC socket according to claim 1, wherein said IC lead pressing means comprises a plurality of members.

* * * * *